United States Patent

Hayashi et al.

Patent Number: 5,969,952
Date of Patent: Oct. 19, 1999

[54] HYBRID IC AND ELECTRONIC DEVICE USING THE SAME

[75] Inventors: Masanobu Hayashi, Kaga; Masao Yonezawa, Matto, both of Japan

[73] Assignee: Murata Manufacturing Co., Ltd., Nagaokakyo, Japan

[21] Appl. No.: 09/169,941

[22] Filed: Oct. 13, 1998

[30] Foreign Application Priority Data

Oct. 14, 1997 [JP] Japan .................................... 9-280665
Sep. 10, 1998 [JP] Japan .................................. 10-256639

[51] Int. Cl.$^6$ ..................................................... H05K 1/14
[52] U.S. Cl. .......................... 361/774; 361/770; 361/803; 361/804; 439/74; 439/83; 257/696
[58] Field of Search .................................... 361/742–744, 361/758, 770, 772–774, 803, 804, 790; 439/69, 74, 83; 257/686, 723, 724, 692, 693, 696

[56] References Cited

U.S. PATENT DOCUMENTS 5,422,516  6/1995  Hosokawa et al. ...................... 257/692
5,588,848  12/1996  Law et al. .................................. 439/83

Primary Examiner—Leo P. Picard
Assistant Examiner—John B. Vigushin
Attorney, Agent, or Firm—Burns, Doane, Swecker & Mathis, LLP

[57] ABSTRACT

In order to provide an improved hybrid IC having a high density, compact in size, capable of being manufactured with a reduced cost, a hybrid IC of the present invention, comprises: a circuit board 2 having formed on the surface thereof a plurality of electrode patterns, and mounting on the same surface a plurality of electronic elements 3; a plurality of connection terminals 4 each formed into a generally rectangular frame structure including mutually facing first and second lateral plates, and mutually facing first and second longitudinal plates. In particular, one of the first and second lateral plates of each connection terminal 4 is fixedly connected to a connection electrode 2a on the circuit board 2. With the use of such structure, it is allowed to dispense with a process of solely connecting the connection terminals, thereby reducing the time and hence the cost for manufacturing a hybrid IC. Further, it is allowed to connect only necessary connection terminals in optionally selected positions, thus avoiding additional cost which is unavoidable in a prior art. Moreover, it is possible to increase the freedom in the designing of a hybrid IC, rendering it possible to produce a hybrid IC which is compact in size, light in weight, and has a high density.

6 Claims, 5 Drawing Sheets

HYBRID IC AND ELECTRONIC DEVICE USING THE SAME

BACKGROUND OF THE INVENTION

1. Field of the Invention

The present invention relates to a hybrid IC and an electronic device using the same, in particular this invention relates to a hybrid IC having connection terminals for connecting the hybrid IC to the surface of a printed circuit board. The invention also relates to an electric device using such hybrid IC.

2. Description of the Related Art

FIG. 13 is a perspective view illustrating several connecting terminals provided on a conventional hybrid IC. As shown in FIG. 13, each clip terminal 60 serving as a connection terminal is formed by bending a metal plate into a generally S-like shape, so as to form three mutually parallel plates 60a, 60b, 60c, and two connecting plates 60d, 60e for connecting together the plates 60a, 60b, 60c, thereby presenting a clip-like connection terminal. A U-shaped portion of the clip terminal 60 consisting of plates 60a, 60d and 60b, is adapted to receive and hold an end portion of a hybrid IC circuit board 61. On either side of the clip terminal 60, there is formed on the circuit board 61 an electrode 61a for solderring connection or for electric connection. In this way, the clip terminal 60 may be soldered at a predetermined position, so as to be connected and fixed thereon. When a hybrid IC fixedly equipped with a plurality of clip terminals 60 is to be attached on to the surface of a printed circuit board (not shown), the plate 60c of each clip terminal 60 is mounted on the electrodes formed on the printed circuit board corresponding to the clip terminal 60 of the hybrid IC. Thus, the hybrid IC and the printed circuit board may be combined together by means of solderring.

FIG. 14 is a perspective view illustrating several connecting terminals provided on another conventional hybrid IC. As shown in FIG. 14, a connector block 70 serving as a connection terminal, comprises a plurality of electrically insulating square pillar members 70a, a plurality of terminal electrodes 70b surrounding the square pillar member 70a. A plurality of electrodes 71a are provided on the surface of the hybrid IC circuit board 71, with each electrode 71a aligned and in contact with a corresponding terminal electrode 70b of the connector block 70. Thus, with the connector block 70 mounted on the circuit board 71, each electrode 71a may be made into a fixed connection with a corresponding terminal electrode 70b, by means of solderring.

When the hybrid IC, with the connector block 70 fixedly attached on its circuit board 71, is to be attached on to a printed circuit board (not shown), the circuit board 71 shown in FIG. 14 shall be made upside down so that the connector block 70 will be mounted on the underside of a printed circuit board. Further, the printed circuit board is also equipped with a plurality of electrodes corresponding to the terminal electrodes 70b of the connector block 70. In fact, these electrodes of the printed circuit board may be fixedly connected with the corresponding terminal electrodes 70b on the circuit board 71, also by means of solderring.

FIG. 15 is a perspective view illustrating several connection terminals provided on a further conventional hybrid IC, which has been disclosed in Japanese Unexamined Patent Publication No. 1-244693. As shown in FIG. 15, a plurality of electrically conductive cubic members 80 each serving as a connection terminal, are provided on a circuit board 81. Each cubic member 80 is formed by a rectangular parallelepiped which is electrically conductive at least on its entire surface. Further, a plurality of electrodes 81a each for mounting an electrically conductive cubic member 80, are provided on the surface of the hybrid IC circuit board 81. Thus, these electrodes 81a and the electrically conductive cubic members 80 may be connected together by means of solderring.

When the hybrid IC, having a plurality of electrically conductive cubic members 80 fixedly attached on its circuit board 81, is to be attached on to a printed circuit board (not shown), a circuit board 81 shown in FIG. 15 shall be turned upside down so that the electrically conductive cubic members 80 will be mounted on the underside of a printed circuit board. Further, the printed circuit board is also equipped with a plurality of electrodes corresponding to the electrically conductive cubic members 80. In fact, these electrodes of the printed circuit board may be fixedly connected with the corresponding cubic members 80 on the circuit board 81, also by way of solderring.

However, the above prior arts shown in FIGS. 13–15 have some problems which will be discussed in detail in the following.

Namely, with the clip type terminals 60 shown in FIG. 13, as related above, it is necessary to provide an electrode 61a (for solderring connection) on either side of the clip terminal 60 on the circuit board 61. As a result, in solderring connection areas for connecting the plates 60a of the clip type terminals 60, it is not allowed to mount other electronic elements, thus it is difficult to produce a hybrid IC having a high density. Further, since the plate 60a of each clip type terminal 60 has a certain thickness which, upon solderring, will project upwardly and laterally beyond the upper surface of the circuit substrate board 61, it is difficult to produce a hybrid IC with a compact size. Moreover, since some additional fixing structures in connection with the circuit substrate board 61 are usually different from other electronic elements which are to be fixedly mounted on the hybrid IC, it is necessary not only to have a process for connecting these electronic elements to the hybrid IC, but also necessary to have at least another process to complete a desired solderring connection between these electronic elements and the above-mentioned additional fixing structures (which are in fact for use in connecting each clip type terminal 60 to the circuit substrate board 61). As a result, it is difficult to reduce the cost for manufacturing such hybrid IC.

With the connector block shown in FIG. 14, as related above, since a plurality of terminal electrodes 70b are provided on one square pillar member 70a, it is not allowed to remove one or more terminal electrodes 70b even if they have become not needed any more. This, however, will cause a necessity of providing other terminals such as electrodes 71a on the circuit substrate board 71, hence making it difficult to produce a hybrid IC with a high density. Further, since the connector block 70 has a high rigidity, after the hybrid IC is installed on to a printed circuit board, a positional relationship between the hybrid IC and the printed circuit board will be fixed. As a result, a possible stress caused due to a possible deflection of the printed circuit board will propagate completely to the hybrid IC, causing the hybrid IC to deflect and thus resulting in a damage to the hybrid IC. In more detail, a connection between the connector block 70 and the circuit substrate board 71, and a connection between the connector block 70 and the printed circuit board (not shown), will be broken and thus cause a damage to the connector block 70 itself, rendering it difficult to obtain a reliability for thus produced electronic device.

With the electrically conductive cubic members 80 shown in FIG. 15, as related above, since each cubic member 80 has a similar rigidity as the above connector block 70 (shown in FIG. 14), it is impossible to absorb a stress caused by a possible deflection of a printed circuit board (not shown), rendering it difficult to obtain a reliability for thus produced electronic device.

Further, referring to FIG. 16, when a reflow-solderring treatment is performed to attach an electrically conductive cubic member 80 to a circuit substrate body 81, since each cubic member 80 is small and hence is light in weight, and since a contact surface for each cubic member 80 to contact a circuit board 81 is a flat surface, the cubic member 80 is likely to float upwardly in a melt solder 82, causing the cubic member 80 to get inclined and then fixed in an inclined position with respect to the circuit board 81.

SUMMARY OF THE INVENTION

In view of the above discussed problems associated with the above mentioned prior arts, it is an object of the present invention to provide an improved hybrid IC having a high density, compact in size, capable of being manufactured with a reduced cost, and having an improved reliability after the hybrid IC has been installed on to a printed substrate board.

Another object of the present invention is to provide an electronic device employing the improved hybrid IC.

In order to solve the above discussed problem and to achieve the above mentioned objects, a hybrid IC of the present invention, comprises: a circuit board having formed on the surface thereof a plurality of electrode patterns, and mounting on the same surface a plurality of electronic elements; a plurality of connection terminals each formed into a generally rectangular frame structure including mutually facing first and second lateral plates, and mutually facing first and second longitudinal plates.

In particular, one of the first lateral plate and the second lateral plate of each connection terminal is fixedly connected to an electrode pattern on the circuit board.

Further, an electronic device of the present invention is characterized in that the above hybrid IC is mounted on a printed circuit board having formed on the surface thereof a circuit pattern, the other of the first lateral plate and the second lateral plate of each connection terminal is connected to the circuit pattern formed on the printed circuit board.

With the use of the above improved hybrid IC, it is possible to produce an electronic device which is compact in size, light in weight, has a high density and may be manufactured with a low cost.

Further, with the use of the above improved electronic device, after a hybrid IC has been mounted and fixed on a printed circuit board, it is possible to prevent a stress (caused due to a deflection of the printed circuit board) from propagating to the hybrid IC, thereby ensuring and improving a reliability for the electronic device.

DESCRIPTION OF THE PREFERRED EMBODIMENT

Figure 1:
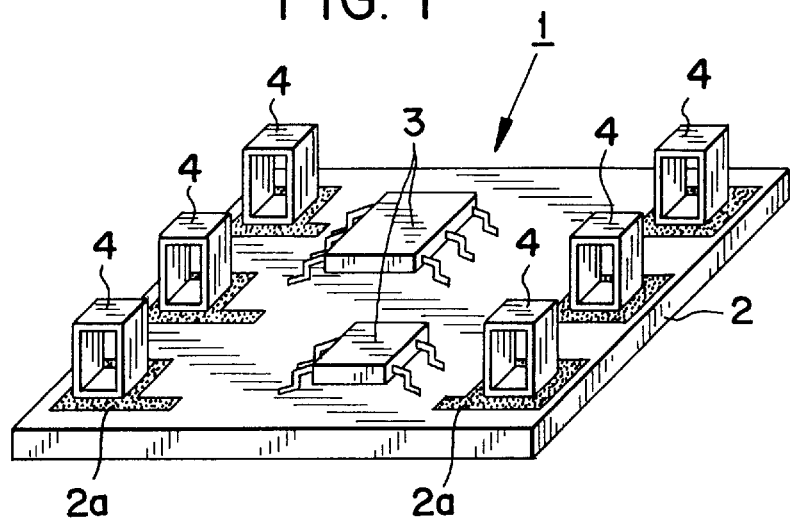
FIG. 1 is a perspective view illustrating a hybrid IC made according to an embodiment of the present invention.

FIG. 1 is used to illustrate a hybrid IC made according to a first embodiment of the present invention. Referring to FIG. 1, the hybrid IC 1 includes a circuit board 2, on the surface of which are formed a plurality of electrode patterns (now shown) and are mounted thereon a plurality of electronic elements 3. Further, on the surface of the circuit board 2, there are formed a plurality of connection electrodes 2a which are in fact also serving as electrode patterns, and a plurality of connection terminals 4 are soldered to the connection electrodes 2a.

Figure 2:
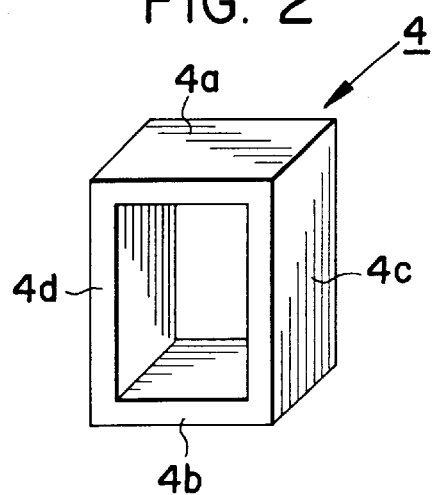
FIG. 2 is a perspective view illustrating a connection terminal to be used in the hybrid IC of FIG. 1.

FIG. 2 is used to illustrate the structure of each connection terminal 4. Referring to FIG. 2, a connection terminal 4 includes a first lateral plate 4a and a second lateral plate 4b, which are arranged on the upper side and the lower side (as viewed in FIG. 2), respectively, so that they are directly facing one another. Further, the connection terminal 4 includes a first longitudinal plate 4c and a second longitudinal plate 4d, which are arranged on the right side and the left side (as viewed in FIG. 2), respectively, so that they are directly facing one another. In more detail, the longitudinal plate 4c and the longitudinal plate 4d are in connection with the lateral plate 4a and the lateral plate 4b, in a manner such that a square frame-like structure is formed. In practice, each connection terminal 4 is constructed by forming an electrode on the surface of an electrically conductive material such as a metal, or on the surface of an insulating material. At least, the first lateral plate 4a and the second lateral plate 4b should be capable of easily receiving a soldering treatment, so that a desired electrical conductivity may be maintained between the two lateral plates 4a and 4b. Although not shown in FIG. 1, each second lateral plate 4b is soldered on to a connection electrode 2a.

With the hybrid IC 1 constructed in the above manner, since the connection terminals 4 and other electronic elements 3 are allowed to be connected to the circuit board 2, simultaneously and with the use of the same equipment, it is allowed to dispense with a process (solely for connecting the connection terminals) which is otherwise indispensable in a prior art, thereby reducing the time and hence the cost for manufacturing the hybrid IC. Further, since it is allowed to connect only necessary connection terminals in optionally selected positions without having to replace some major members (such as a connector block 70 used in one of the above discussed prior arts), it is allowed to save time and cost which are otherwise unavoidable in the above prior art, thereby increasing the freedom in the designing of a hybrid IC, rendering it possible to produce a hybrid IC which is compact in size and has a high density. In addition, since each connection terminal is formed into a square frame structure, a hybrid IC employing these connection terminals is lighter in weight than a conventional hybrid IC employing connector blocks 70 or electrically conductive cubic members 80.

Figure 3:
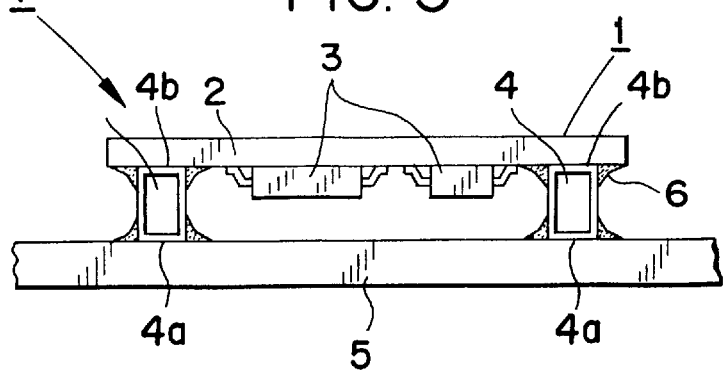
FIG. 3 is a side elevation illustrating an electronic device made according to one embodiment of the present invention.

FIG. 3 is used to illustrate an electronic device 7 employing the above hybrid IC shown in FIG. 1. Referring to FIG. 3, the electronic device 7 has a printed circuit board 5 on which a circuit pattern (not shown) has been formed, and a hybrid IC 1 is mounted upside down thereon. In detail, the first lateral plate 4a of each connection terminal 4 is soldered on the circuit pattern formed on the printed circuit board 5.

With the use of the above structure illustrated in FIG. 3, it is possible to produce an electronic device which is compact in size, light in weight, has a high density and may be manufactured with a low cost.

Although it has been described in the present specification that the first lateral plate 4a of each connection terminal 4 is connected to the printed circuit board 5 and the second lateral plate 4b thereof is connected to the circuit substrate board 2, it is also possible that the first and second lateral plates 4a and 4b may be connected in a manner that is just opposite to that shown in FIG. 3, i.e., with the first lateral plates 4a connected to the circuit board 2, and with the second lateral plates 4b connected to the printed circuit board 5.

Figure 4:
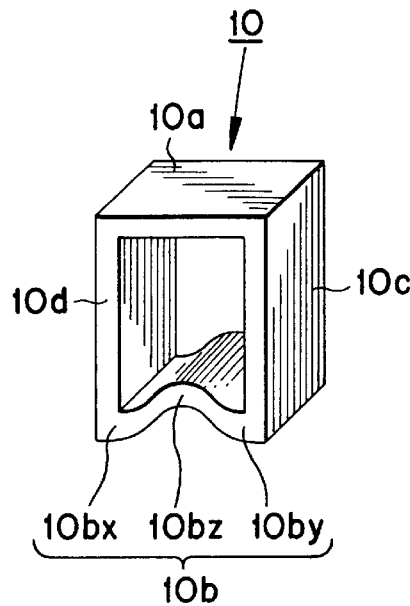
FIG. 4 is a perspective view illustrating another connection terminal to be used in a hybrid IC of the present invention.

FIG. 4 illustrates another example of a connection terminal 10 for use in a hybrid IC of the present invention. As shown in FIG. 4, the connection terminal 10 includes a first lateral plate 10a and a second lateral plate 10b, which are arranged on the upper side and the lower side (as viewed in FIG. 4), respectively, so that they are directly facing each other. Further, the connection terminal 10 includes a first longitudinal plate 10c and a second longitudinal plate 10d, which are arranged on the right side and the left side (as viewed in FIG. 4), respectively, so that they are directly facing one another. In more detail, the longitudinal plate 10c and the longitudinal plate 10d are in connection with the lateral plate 10a and the lateral plate 10b, in a manner such that a square frame-like structure is formed. In practice, the connection terminal 10 is constructed by forming an electrode on the surface of an electrically conductive material such as a metal, or on the surface of an insulating material. At least, the first lateral plate 10a and the second lateral plate 10b should be capable of easily receiving a solderring treatment, so that a desired electrical conductivity may be maintained between the two lateral plates 10a and 10b. In particular, the second lateral plate 10b is bent inwardly at its middle position so that a recess portion 10bz is formed as shown in FIG. 4. In more detail, due to the formation of the recess portion 10bz, another two convex portions 10bx and 10by are thus formed on both sides of the recess portion 10bz on the second lateral plate 10b of the connection terminal 10.

Figure 5:
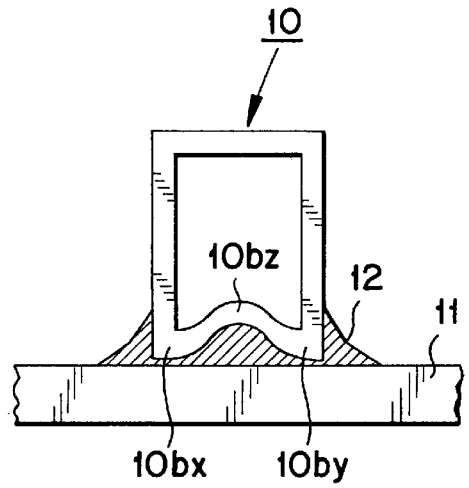
FIG. 5 is a side view illustrating a condition where the connection terminal of FIG. 4 has been fixed on a circuit board of a hybrid IC.

The connection terminal 10 shown in FIG. 4 may be attached to a circuit board 11 of a hybrid IC, in a manner as illustrated in FIG. 5. Referring to FIG. 5, when the second lateral plate 10b is soldered to a connection electrode (not shown, but serving as a circuit pattern on the surface of the circuit board 11 of a hybrid IC), since an amount of a solder will flow into an internal space formed between the recess portion 10bz and the circuit board 11, the connection terminal 10 may be prevented from floating upwardly. As a result, only the two convex portions 10bx and 10by of each connection terminal 10 get in contact with the connection electrodes formed on the circuit board 11, so that the connection terminal 10 is sure to be vertically fixed on the circuit board 11. In FIG. 5, hatched portions between the connection terminal 10 and the circuit board 11 represent an amount of solder which has been applied to the circuit board for fixing the terminal 10 thereon.

Figure 16:
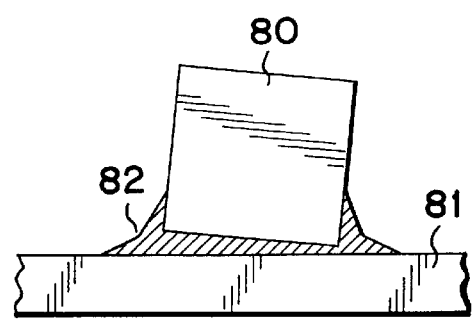
FIG. 16 is a side view illustrating a condition where a connection terminal of FIG. 15 is fixedly connected on to a circuit board of a hybrid IC, but in an undesired inclined position.
Figure 13:
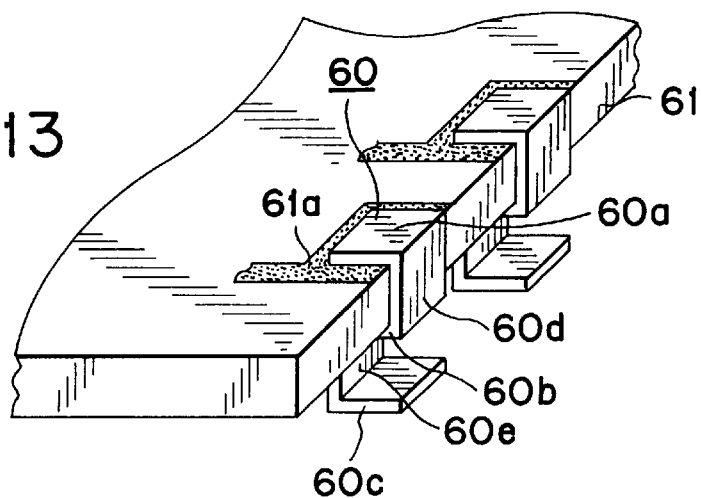
FIG. 13 is a perspective view illustrating one kind of conventional connection terminals fixedly connected on to a hybrid IC.
Figure 14:
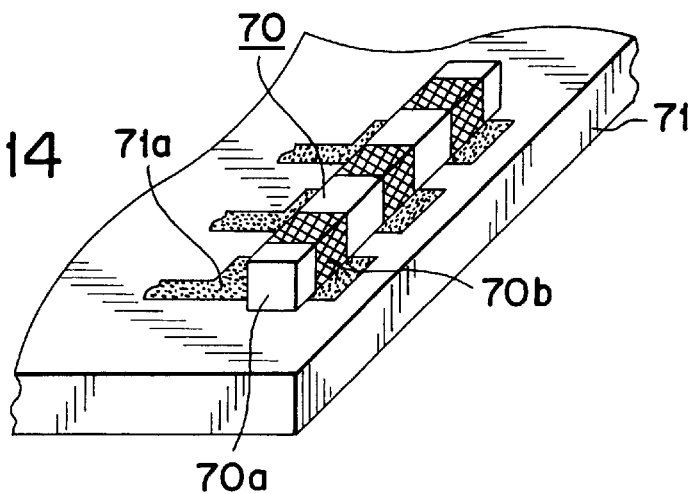
FIG. 14 is a perspective view illustrating another kind of conventional connection terminals fixedly connected on to a hybrid IC.
Figure 15:
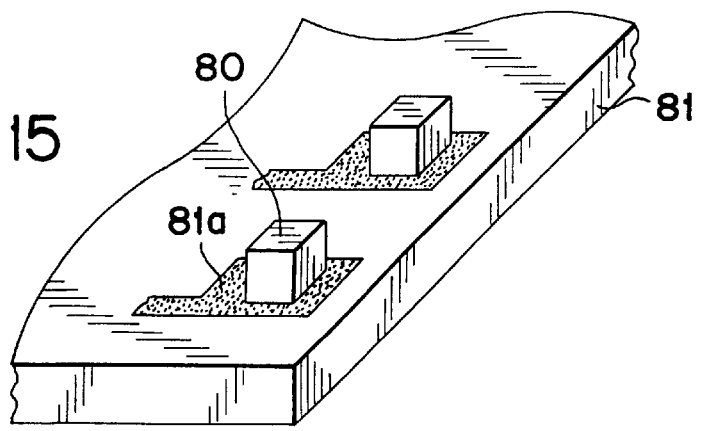
FIG. 15 is a perspective view illustrating a further kind of conventional connection terminals fixedly connected on to a hybrid IC.

In this way, with the use of connection terminal 10, since there has been formed a recess portion 10bz between the two convex portions 10bx and 10by, such a recess portion 10bz serves as an internal space to receive inwardly flowing solder, it is difficult for the flowing solder to stay under the two convex portions 10bx and 10by. As a result, it is possible to avoid a problem as shown in FIG. 16 where an electrically conductive cubic member 80 serving as a connection terminal is floating on the solder 82.

On the other hand, after the lateral plate 10b of each connection terminal 10 is attached on to the circuit board 11 to form a hybrid IC, such an hybrid IC may be mounted and then soldered in position on a printed circuit board, so as to be connected with connection electrodes (defined by a circuit pattern) formed on the printed circuit board. Under this circumstance, not only the weight of the connection terminals 10, but also the weight of the circuit board 11 and the weight of electronic elements attached on to the circuit board 11, will all act correspondingly. As a result, it is possible to prevent the hybrid IC from floating, which is otherwise unavoidable due to a buoyancy of the solder, thereby allowing the first lateral plate 10a to be formed in a flat shape.

Figure 6:
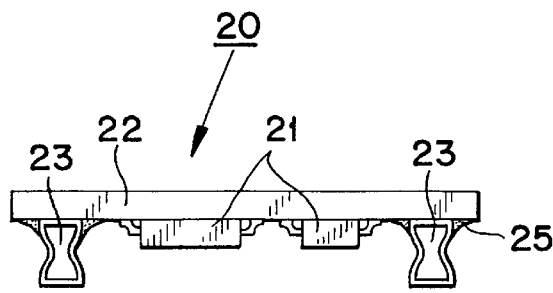
FIG. 6 is a side view illustrating a hybrid IC made according to a further embodiment of the present invention.

FIG. 6 is used to illustrate a hybrid IC 20 made according to a further embodiment of the present invention. Referring to FIG. 6, the hybrid IC 20 includes a circuit substrate board 22, on the surface of which are formed a plurality of electrode patterns (not shown) and are fixed thereon a plurality of electronic elements 21 by virtue of solder 25. Further, on the surface of the circuit substrate board 22, there are formed a plurality of connection terminals 23 also by virtue of solder 25.

Figure 7:
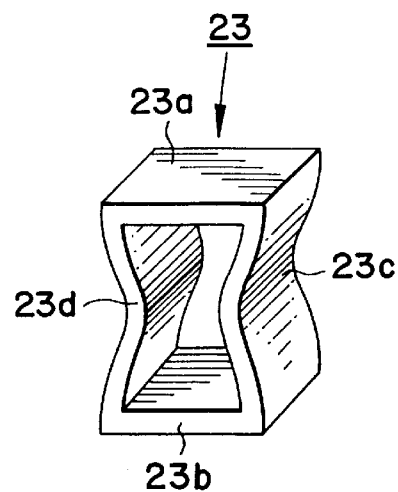
FIG. 7 is a perspective view illustrating a further connection terminal to be used in a hybrid IC of FIG. 6.

FIG. 7 is used to illustrate the structure of each connection terminal 23. Referring to FIG. 7, a connection terminal 23 includes a first lateral plate 23a and a second lateral plate 23b, which are arranged on the upper side and the lower side (as viewed in FIG. 7), respectively, so that they are directly facing each other. Further, the connection terminal 23 includes a first longitudinal plate 23c and a second longitudinal plate 23d, which are arranged on the right side and the left side (as viewed in FIG. 7), respectively, so that they are directly facing one another. In more detail, the longitudinal plate 23c and the longitudinal plate 23d are in connection with the lateral plate 23a and the lateral plate 23b, in a manner such that a square frame-like structure is formed. In practice, each connection terminal 23 is constructed by forming an electrode on the surface of an electrically conductive material such as a metal, or on the surface of an insulating material. At least, the first lateral plate 23a and the second lateral plate 23b should be capable of easily receiving a solderring treatment, so that a desired electrical conductivity may be maintained between the two lateral plates 23a and 23b. Further, each of the longitudinal plates 23c and 23d is bent inwardly at its middle position. Then, a plurality of connection terminals 23 each formed in a shape as shown in FIG. 7 are soldered on to the circuit pattern formed on a circuit board 22, through either the first lateral plate 23a or the second lateral plate 23b.

A hybrid IC 20 formed in a manner shown in FIG. 6 has been proved to be capable of producing similar effects obtainable by the hybrid IC 1 shown in FIG. 1.

Figure 8:
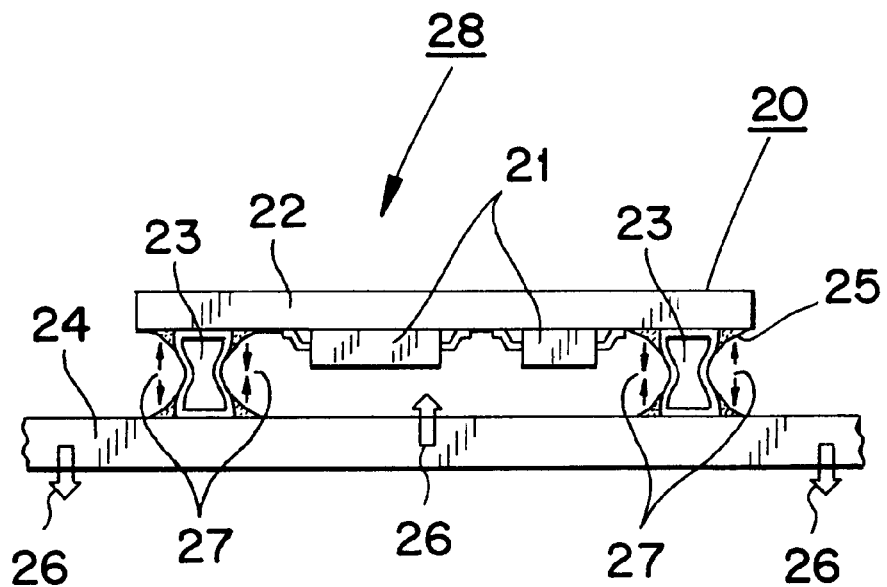
FIG. 8 is a side elevation illustrating an electronic device made according to a further embodiment of the present invention.

FIG. 8 is used to illustrate a further example of an electronic device made according to the present invention. As shown in FIG. 8, an electronic device 28 includes a printed circuit board 24 on which is formed a circuit pattern (not shown). Mounted on the printed circuit board 24 is a hybrid IC 20 shown in FIG. 6. In more detail, the electronic device 28 is formed by solderring either the first lateral plate 23a or the second lateral plate 23b of each connection terminal 23 to the circuit pattern on the printed circuit board 24 by virtue of solder 25.

With the use of the structure shown in FIG. 8, the electronic device 28 is allowed to be made as compact as the hybrid IC 20, so as to provide an electronic product having a high density, light in weight, low in manufacturing cost.

Figure 9:
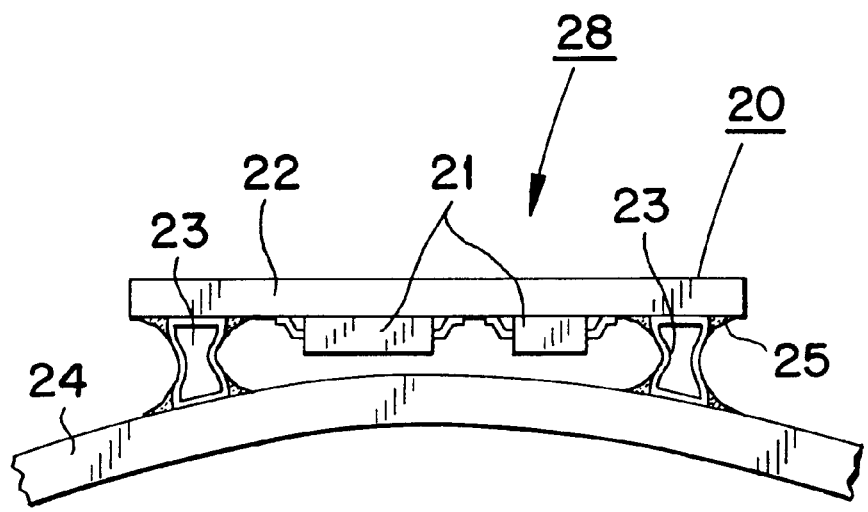
FIG. 9 is a side elevation illustrating the electronic device of FIG. 8, with its printed circuit board in a deflected condition.

However, with the electronic device 28, a mechanical force or a heat will cause the printed circuit board 24 to deflect because it receives several forces shown by arrows 26 in FIG. 8. Under this circumstance, the use of connection terminals 23 will result in a situation in which one of the longitudinal plates 23c, 23d of each connection terminal 23 will be extended, and at same time, the other of the two longitudinal plates 23c, 23d will be retracted, as indicated by arrows 27 in FIG. 8. Consequently, as shown in FIG. 9, the hybrid IC 20 may be protected from being affected by a deflection of the printed circuit board 24, thereby ensuring that the hybrid IC 20 may be fixedly connected on the printed circuit board 24 in a stabilized manner. In this way, with the electronic device 24, since the connection terminals 23 of the hybrid IC 20 are capable of absorbing a possible deflection of the printed circuit board 24, the deflection of the printed circuit board 24 will become a stress exerting on the hybrid IC and on the junctions in connection with the printed circuit board 24 and the connection terminals 24, thereby avoiding any possible damage to the hybrid IC 20 and preventing a possible peeling of the solder applied to the junctions.

On the other hand, it is also possible that the printed circuit board 24 will deflect because of receiving forces in directions opposite to those shown by arrows 26 in FIG. 8. At this moment, one of the longitudinal plates 23c, 23d of each connection terminal 23 will be extended, and the other of the two longitudinal plates 23c, 23d will be retracted, in directions just opposite to those shown in FIG. 9, thereby ensuring the same effect.

In addition, the configuration of the longitudinal plates 23c and 23d of a connection terminal is allowed to have other shapes than that shown in FIG. 7. For instance, FIGS. 10 and 11 are used to illustrate further examples of connection terminals in which two longitudinal plates on the right and left sides have different shapes.

Figure 10:
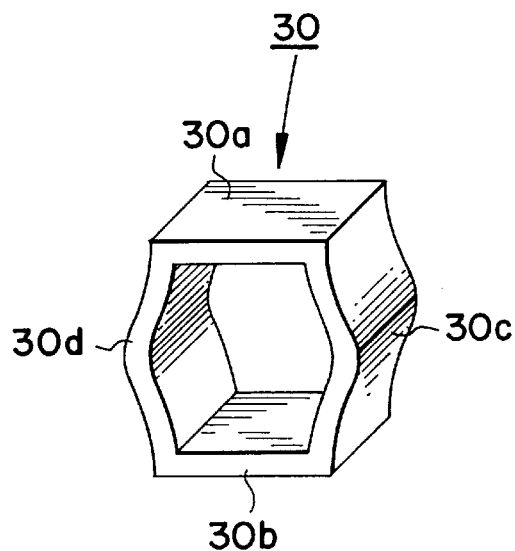
FIG. 10 is a perspective view illustrating a further connection terminal to be used in a hybrid IC of the present invention.

Referring to FIG. 10, a connection terminal 30 comprises a first lateral plate 30a, a second lateral plate 30b, a first longitudinal plate 30c, a second longitudinal plate 30d, with the middle portions of the two longitudinal plates 30c and 30d bent outwardly in opposite directions.

Figure 11:
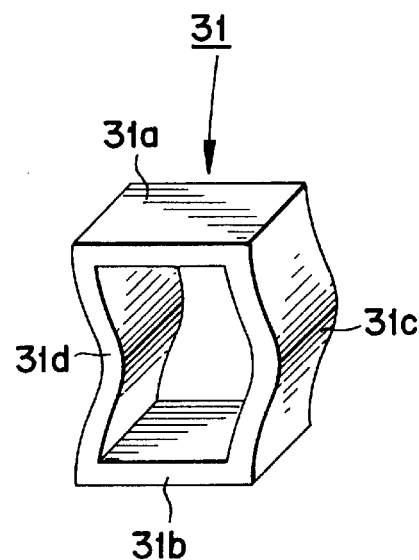
FIG. 11 is a perspective view illustrating a further connection terminal to be used in a hybrid IC of the present invention.

Referring to FIG. 11 a connection terminal 31 comprises a first lateral plate 31a, a second lateral plate 31b, a first longitudinal plate 31c, a second longitudinal plate 31d, with the middle portions of the two longitudinal plates 31c and 31d bent in the same direction.

With the use of the connection terminal 30 or 31, although the longitudinal plates are bent in the manners different from that shown in FIG. 7, these bent portions will act as a spring means extending or retracting, so that they are similarly able to absorb a possible deflection of the printed circuit board, thereby avoiding any possible damage to the hybrid IC, preventing a possible peeling of the solder from the hybrid IC, and preventing the peeling of the solders from junctions in connection with the printed circuit board and the connection terminals.

Although it has been described in the above embodiments that a connection terminal comprises a first lateral plate, a second lateral plate, two longitudinal plates, which are connected in a manner such that a square frame structure is formed, it is also possible to have a connection terminal formed into other shapes. For example, one of the four plates constituting a connection terminal is allowed to have a different shape from other plates, as shown in FIG. 12.

Figure 12:
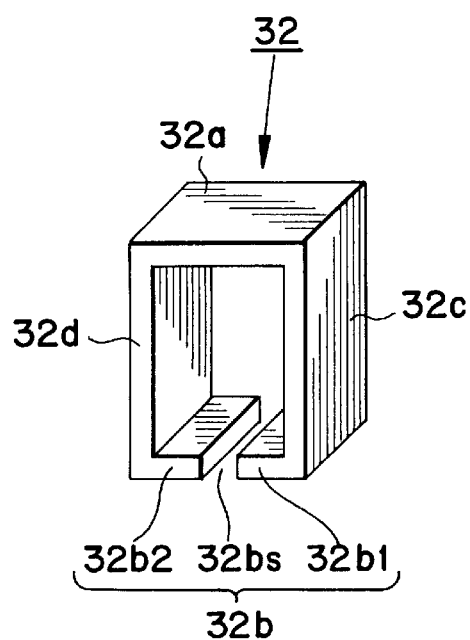
FIG. 12 is a perspective view illustrating a further connection terminal to be used in a hybrid IC of the present invention.

As shown in FIG. 12, a connection terminal 32 comprises a first lateral plate 32a, a second lateral plate 32b, a first longitudinal plate 32c, a second longitudinal plate 32d, with the second lateral plate 32b being formed with a slot 32bs so that the second lateral plate is divided into two portions 32b1 and 32b2.

In this way, a connection terminal may be formed in a manner such that any one of the two lateral plates is provided with a slot so that it is divided into two portions. As a result, a connection terminal does not have to be formed into a square frame structure, rather, it may be formed into a shape shown in FIG. 12 by properly bending a metal plate, thereby reducing a manufacturing cost for producing a connection terminal.

With the use of the hybrid IC made according to the present invention, it is allowed to obtain at least the following effects.

Firstly, a hybrid IC of the present invention, comprises: a circuit board having formed on the surface thereof a plurality of electrode patterns, and mounting on the same surface a plurality of electronic elements; a plurality of connection terminals each formed into a generally rectangular frame structure including mutually facing first and second lateral plates, and mutually facing first and second longitudinal plates. In particular, one of the first lateral plate and the second lateral plate of each connection terminal is fixedly connected to an electrode pattern on the circuit board. Therefore, other electronic elements to be mounted on the hybrid IC and the connection terminals are allowed to be connected to the circuit board, simultaneously, with the use of the same equipment. Thus, it is allowed to dispense with a process (only for connecting the connection terminals) which is otherwise indispensable in a prior art, thereby reducing the time and hence the cost for manufacturing a hybrid IC. Further, since it is allowed to connect only necessary connection terminals in optionally selected positions without having to replace some major members (such as connector blocks used in one of the above discussed prior arts), it is allowed to save time and cost which are otherwise unavoidable in the above prior art, thereby increasing the freedom in the designing of a hybrid IC, rendering it possible to produce a hybrid IC which is compact in size and has a high density. In addition, since each connection terminal is formed into a rectangular frame structure consisting of plate-shaped materials, a hybrid IC employing these connection terminals is lighter in weight than a conventional hybrid IC employing connector blocks or electrically conductive cubic bodies.

Secondly, since an electronic device made according to the present invention employs an improved hybrid IC manufactured in the above manner, it is possible to produce an electronic device which is compact in size, light in weight, has a high density and may be manufactured with a low cost. Further, since the two longitudinal plates of each connection terminal are bent in a predetermined desired manner, these connection terminals are able to extend or retract so as to absorb a possible deflection of the printed circuit board (after a hybrid IC has been mounted and fixed on a printed circuit board). In this way, the deflection of the printed circuit board will become a stress exerting on the soldered connecting portion, thereby avoiding any possible damage to the hybrid IC, preventing a possible peeling of the solder from the hybrid IC, and preventing the peeling of the solders from junctions connecting the printed circuit board and the connection terminals, thus ensuring and improving a reliability for the electronic device.

What is claimed is:

1. A hybrid IC, comprising:
   a circuit board having formed on the surface thereof a plurality of electrode patterns, and mounting on the same surface a plurality of electronic elements; and
   a plurality of connection terminals each formed into a generally rectangular frame structure including mutually facing first and second lateral plates, and mutually facing first and second longitudinal plates, one of said first and second lateral plates is bent inwardly at a middle portion so as to prevent floating when fixedly connected;
   wherein one of the first lateral plate and the second lateral plate of each connection terminal is fixedly connected to an electrode pattern on the circuit board.

2. An electronic device, characterized in that a hybrid IC as claimed in claim 1 is mounted on a printed circuit board having formed on the surface thereof a circuit pattern, the other of the first lateral plate and the second lateral plate of each connection terminal is connected to the circuit pattern formed on the printed circuit board.

3. A hybrid integrated circuit comprising:
   a circuit board having formed on the surface thereof a plurality of electrode patterns, and mounting on the same surface a plurality of electronic elements; and
   a plurality of connection terminals each formed into a generally rectangular frame structure including mutually facing first and second lateral plates, and mutually facing first and second longitudinal plates, each of said first and second longitudinal plates is bent at a middle portion thereof so as to absorb deflections;
   wherein one of the first lateral plate and the second lateral plate of each connection terminal is fixedly connected to an electrode pattern on the circuit board.

4. The hybrid integrated circuit of claim 3 wherein said first and second longitudinal plates are bent inwardly.

5. The hybrid integrated circuit of claim 3 wherein said first and second longitudinal plates are bent outwardly.

6. The hybrid integrated circuit of claim 3 wherein said first and second longitudinal plates are bent in a same direction.

* * * * *